(12) United States Patent
Zhang (10) Patent No.: US 10,437,144 B2
(45) Date of Patent: Oct. 8, 2019

(54) MASK ASSEMBLY INCLUDING FIRST AND SECOND SUPPORT SHEETS

(71) Applicant: BOE Technology Group Co., Ltd., Beijing (CN)

(72) Inventor: Wei Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/813,504

(22) Filed: Nov. 15, 2017

(65) Prior Publication Data

US 2018/0312957 A1   Nov. 1, 2018

(30) Foreign Application Priority Data

Apr. 28, 2017   (CN) .......................... 2017 1 0297505

(51) Int. Cl.
| | |
|---|---|
| *G03F 1/64* | (2012.01) |
| *C23C 14/12* | (2006.01) |
| *B05C 21/00* | (2006.01) |
| *H01L 51/00* | (2006.01) |
| *C23C 14/04* | (2006.01) |
| *B05D 1/32* | (2006.01) |

(52) U.S. Cl.
CPC .............. *G03F 1/64* (2013.01); *C23C 14/042* (2013.01); *C23C 14/044* (2013.01); *C23C 14/12* (2013.01); *B05C 21/005* (2013.01); *B05D 1/32* (2013.01); *H01L 51/0011* (2013.01)

(58) Field of Classification Search
CPC . G03F 1/64; G03F 1/66; C23C 16/042; C23C 14/042
See application file for complete search history.

(56) References Cited

U.S. PATENT DOCUMENTS

| | | | | |
|---|---|---|---|---|
| 6,204,509 | B1* | 3/2001 | Yahiro | B82Y 10/00 250/397 |
| 6,277,658 | B1* | 8/2001 | Jeng | H01L 23/544 118/721 |
| 2002/0102754 | A1* | 8/2002 | Fujimori | C23C 14/042 438/22 |
| 2004/0020435 | A1* | 2/2004 | Tsuchiya | C23C 14/042 118/723 VE |

(Continued)

*Primary Examiner* — Karl Kurple
(74) *Attorney, Agent, or Firm* — Arent Fox LLP; Michael Fainberg (57) ABSTRACT

Disclosed are a mask assembly, and a method for assembling the same. The mask assembly includes: a frame including a hollow area; a mask arranged across the hollow area, wherein two opposite ends of the mask are fixed on the frame; and first support sheets configured to support the mask, wherein the first support sheets include first sub-support sheets and second sub-support sheets stacked over each other, the first sub-support sheets and the second sub-support sheets are arranged across the hollow area of the frame, and two opposite ends of each of the first sub-support sheets, and two opposite ends of each of the second sub-support sheets are fixed on the frame; wherein orthographic projections of the first sub-support sheets onto the second sub-support sheets lie into the second sub-support sheets; and the thickness of the second sub-support sheets is smaller than the thickness of the first sub-support sheets.

10 Claims, 10 Drawing Sheets

(56) References Cited

U.S. PATENT DOCUMENTS

| | | | |
|---|---|---|---|
| 2005/0019968 A1* | 1/2005 | Kuwahara | C23C 14/042 438/26 |
| 2008/0018236 A1* | 1/2008 | Arai | C23C 14/042 313/504 |
| 2011/0146573 A1* | 6/2011 | Park | C23C 14/042 118/712 |
| 2015/0101536 A1* | 4/2015 | Han | C23C 14/042 118/721 |

* cited by examiner

MASK ASSEMBLY INCLUDING FIRST AND SECOND SUPPORT SHEETS

CROSS-REFERENCE TO RELATED APPLICATION

This application claims priority of Chinese Patent Application No. 201710297505.2, filed on Apr. 28, 2017, which is hereby incorporated by reference in its entirety.

FIELD

The present disclosure relates to the field of vapor deposition, and particularly to a mask assembly, and a method for assembling the same.

BACKGROUND

At present, an Organic Light Emitting Diode (OLED) display device has been increasingly widely applied due to its self-light-emitting, high response speed, high brightness, low weight, small thickness, and other advantages.

The OLED display is typically manufactured in a vapor deposition process, an inkjet printing process, etc., and a vapor-deposition mask used in the vapor deposition process is of particular importance to manufacturing of an organic electroluminescent diode display (OLED) panel with a small size. The traditional vapor-deposition mask is categorized into an open mask and a Fine Metal Mask (FMM), where it is not very difficult to fabricate a mask assembly including the open mask, but very difficult to fabricate a mask assembly including the FMM. The mask assembly including the FMM typically includes a frame, support sheets, the FMM, etc.

SUMMARY

Embodiments of the disclosure provide a mask assembly. The mask assembly includes: a frame including a hollow area; a mask arranged across the hollow area of the frame, wherein two opposite ends of the mask are fixed on the frame; and first support sheets configured to support the mask, wherein the first support sheets include first sub-support sheets and second sub-support sheets; wherein the second sub-support sheets are stacked over the first sub-support sheets, the first sub-support sheets and the second sub-support sheets are arranged across the hollow area of the frame, and two opposite ends of each of the first sub-support sheets, and two opposite ends of each of the second sub-support sheets are fixed on the frame; wherein orthographic projections of the first sub-support sheets extends into the second sub-support sheets; and a thickness of the second sub-support sheets is smaller than a thickness of the first sub-support sheets.

Embodiments of the disclosure provides a method for assembling a mask assembly, the method includes: arranging first sub-support sheets across a hollow area of a frame, and fixing two opposite ends of each of the first sub-support sheets on the frame; arranging second sub-support sheets above the first sub-support sheets, and fixing two opposite ends of each of the second sub-support sheets on the frame, wherein orthographic projections of the first sub-support sheets extend into the second sub-support sheets, and a thickness of the second sub-support sheets is smaller than a thickness of the first sub-support sheets; and the first sub-support sheets and the second sub-support sheets constitute first support sheets; and arranging a mask across the hollow area of the frame, and fixing two opposite ends of the mask on the frame.

BRIEF DESCRIPTION OF THE DRAWINGS

In order to make the technical solutions according to the embodiments of the disclosure, or in the prior are more apparent, the drawings to which reference will be made in the description of the embodiments of the disclosure, or the related art will be described below briefly, and apparently the drawings to be described below illustrate only some of the embodiments of the disclosure, but those ordinarily skilled in the art can further derive from these drawings other drawings without any inventive effort.

DETAILED DESCRIPTION OF THE EMBODIMENTS

The technical solutions according to embodiments of the disclosure will be described below clearly and fully with reference to the drawings in the embodiments of the disclosure. Apparently the embodiments to be described are only a part but not all of the embodiments of the disclosure. Based upon the embodiments here of the disclosure, all the other embodiments which can occur to those ordinarily skilled in the art without any inventive effort shall come into the scope of the disclosure as claimed.

In the related art, it is common to form a pattern on a substrate to be vapor-deposited, using a mask assembly, and in order to form a pattern accurately and uniformly in a working area on the substrate to be vapor-deposited (when the substrate to be vapor-deposited is a display substrate, the working area can be a display area, for example), so a pattern is typically also formed in an area around the working area, which is referred to a dummy area. In order to form the patterns in both the working area and the dummy area on the substrate to be vapor-deposited, patterns are arranged in both a working area (an area corresponding to the working area of the substrate to be vapor-deposited) and a dummy area (an area corresponding to the dummy area of the substrate to be vapor-deposited) on a mask of a mask assembly. The mask assembly needs to be fabricated by supporting the mask using a support sheet to prevent the patterns from being formed imprecisely using the mask assembly when the mask droops. The support sheet supporting the mask may have such an overlapping area with the mask that shields the mask. In the related art, in order to avoid the dummy area from being affected by the support sheet, both the position at which the support sheet is arranged relative to the mask, and the area on the mask, which is shielded by the support sheet are preset so that the mask assembly can be fabricated by fixing the mask and the support sheet at the preset positions. However the traditional support sheet with a large thickness tends to be deformed while during standing net, thus degrading the precision of networking the support sheet, and the precision of shielding by the support sheet.

In view of this, an embodiment of the disclosure provides a mask assembly as illustrated in FIG. 1 to FIG. 6, where the mask assembly includes: a frame 10 including a hollow area; a mask 20 arranged across the hollow area of the frame 10, where two opposite ends of the mask 20 are fixed on the frame 10; and first support sheets 30 configured to support the mask 20, where the first support sheets 30 include first sub-support sheets 301 and second sub-support sheets 302, the second sub-support sheets 302 are stacked over the first sub-support sheets 301, the first sub-support sheets 301 and the second sub-support sheets 302 are arranged across the hollow area of the frame 10, and two opposite ends of the first sub-support sheets 301, and two opposite ends of the second sub-support sheets 302 are fixed on the frame 10. As illustrated in FIG. 2A and FIG. 2B (FIG. 2A and FIG. 2B are schematic sectional views respectively along AA' and BB' in FIG. 1), orthographic projections of the first sub-support sheets 301 extends into the second sub-support sheets 302; and the thickness of the second sub-support sheets 302 is smaller than the thickness of the first sub-support sheets 301.

It shall be noted that firstly the hollow area of the frame 10 will not be limited to any particular shape, but may be a rectangle or a round, and the shape of the hollow area can be preset as needed.

Figure 1:
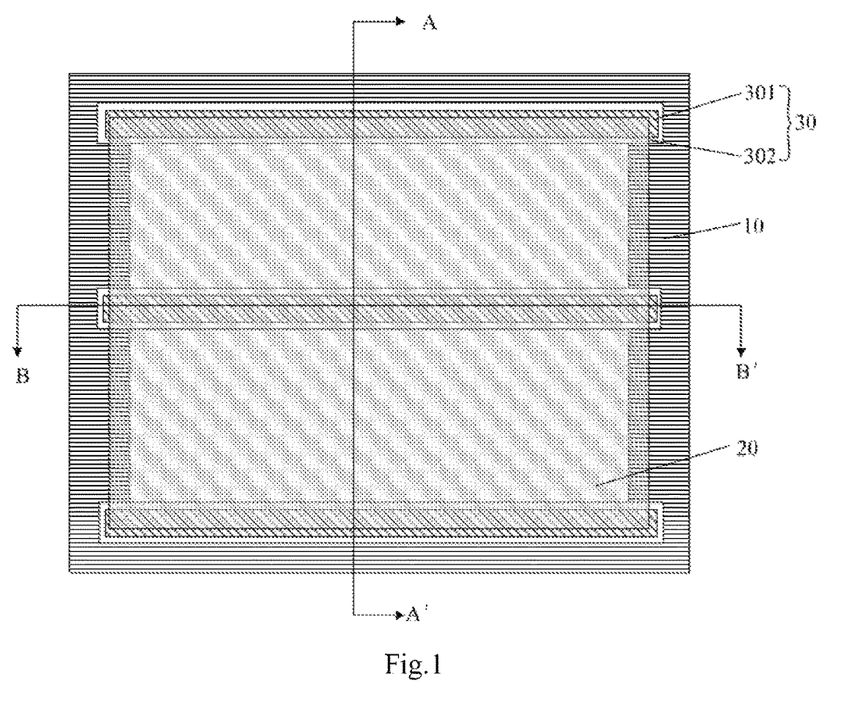
FIG. 1 is a first schematic structural diagram of a mask assembly according to an embodiment of the disclosure.
Figure 2A:
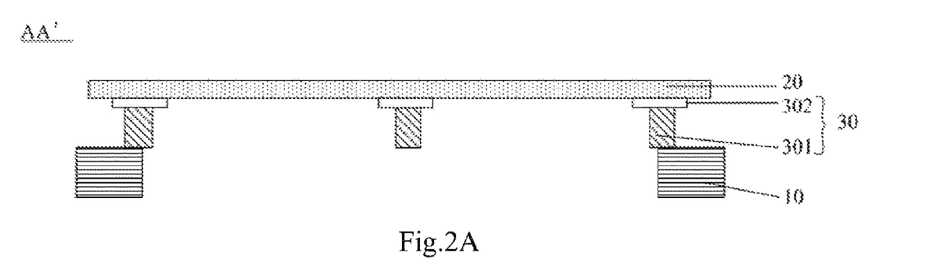
FIG. 2A is a schematic sectional view along AA' in FIG. 1.
Figure 2B:
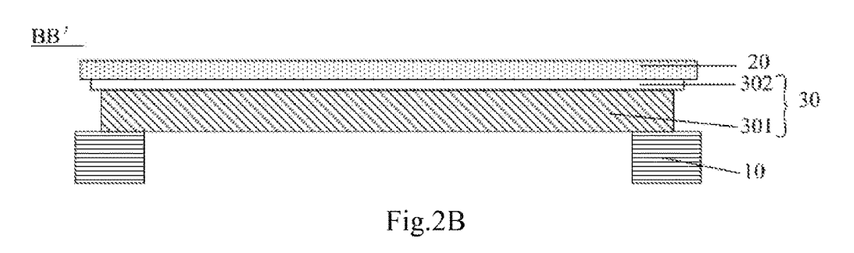
FIG. 2B is a schematic sectional view along BB' in FIG. 1.
Figure 3A:
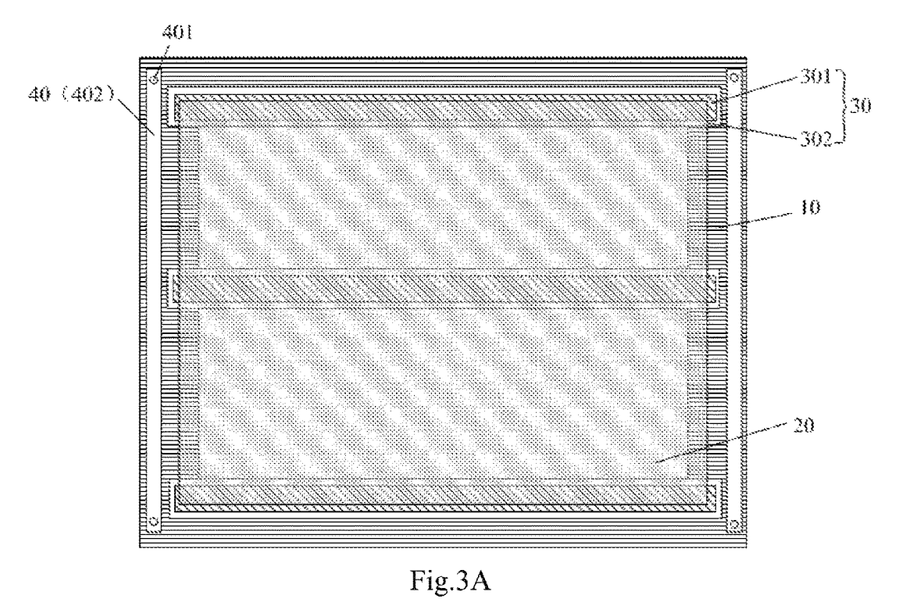
FIG. 3A is a second schematic structural diagram of the mask assembly according to an embodiment of the disclosure.
Figure 3B:
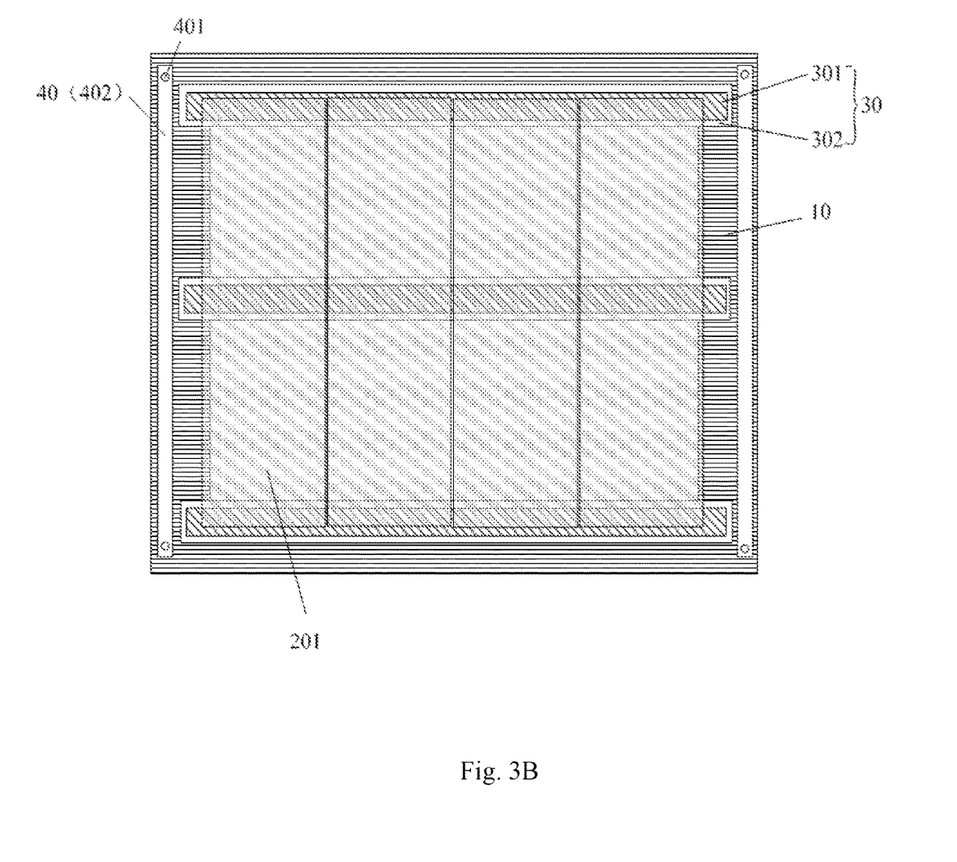
FIG. 3B is a third schematic structural diagram of the mask assembly according to an embodiment of the disclosure.

Secondly the mask 20 will not be limited to any particular type, but may be a fine metal mask as illustrated in FIG. 3B, or an open mask as illustrated in FIG. 3A. When the mask 20 is a fine metal mask, the fine metal mask may include a plurality of mask sheets 201.

Thirdly the orthographic projections of the first sub-support sheets 301 extend into the second sub-support sheets 302, but the difference between the width of the first sub-support sheets 301 and the width of the second sub-support sheets 302 will not be limited to any particular difference as long as the first sub-support sheets 301 can support the mask 20, and even if the first sub-support sheets 301 during standing net and fixed onto the frame 10 are deformed, then the orthographic projections of the deformed first sub-support sheets 301 will also extend into the second sub-support sheets 302.

Those skilled in the art shall appreciate that if the thickness of the support sheets is smaller, then a networking strain to be applied to the support sheets during standing net will be smaller, so the support sheets will be less deformed. In embodiments of the disclosure, since the thickness of the second sub-support sheets 302 is less than the thickness of the first sub-support sheets 301, the second sub-support sheets 302 will not be deformed easily relative to the first sub-support sheets 301. In order to prevent the second sub-support sheets 302 from being deformed, optionally the thickness of the second sub-support sheets 302 shall be as small as possible while the second sub-support sheets 302 can be shielding in embodiments of the disclosure.

Further to this, the number of first support sheets 30 shall be preset as needed, and if there are a larger number of first support sheets 30, then the mask 20 will less droop, where the first support sheets 30 are arranged without hindering the mask assembly from being vapor-deposited normally.

Fourthly the mask 20 and the first support sheets 30 can be fixed on the frame 10 by being soldered thereon.

In the mask assembly according to embodiments of the disclosure, the first support sheets 30 in the mask assembly are structured in two layers in that the first support sheets 30 include the first sub-support sheets 301 and the second sub-support sheets 302, the second sub-support sheets 302 are stacked over the first sub-support sheets 301; and since the thickness of the first sub-support sheets 301 is larger than the thickness of the second sub-support sheets 302, the first sub-support sheets 301 can function in the same way as the support sheets in the related art to support the mask 20. Further to this, the first support sheets 30 further include the second sub-support sheets 302, and since the thickness of the second sub-support sheets 302 is smaller than the thickness of the first sub-support sheets 301, the net-standing strain required for the second sub-support sheets 302 during standing net is smaller, so that the second sub-support sheets 302 can be avoided from being deformed, thus resulting in higher precision of net-standing by the second sub-support sheets 302, and higher precision of shielding by the second sub-support sheets 302. Furthermore the orthographic projections of the first sub-support sheets 301 extend into the second sub-support sheets 302, and since there is higher precision of net-standing by the second sub-support sheets 302, and higher precision of shielding by the second sub-support sheets 302, there is higher precision of net-standing by the first support sheets 30, and higher precision of shielding by the first support sheets 30, thus improving the precision of net-standing by the first support sheets 30, and the precision of shielding by the first support sheets 30, as compared with the related art.

If there are a larger number of first support sheets 30, then the mask 20 will less droop, so optionally the mask assembly includes at least two first support sheets 30 parallel to each other as illustrated in FIG. 1, and FIG. 3A to FIG. 6 in embodiments of the disclosure.

Here the mask assembly can include two first support sheets 30, or can include three or more first support sheets 30.

The mask assembly according to embodiments of the disclosure includes at least two first support sheets 30, so the mask 20 can be prevented in effect from drooping by supporting the mask 20 using the plurality of first support sheets 30 in embodiments of the disclosure as opposed to an arrangement with only one first support sheet 30.

Since there are preset positions of both the first support sheets 30 and the mask 20 on the frame 10, in order to enable both the first support sheets 30 and the mask 20 to be fixed precisely to their corresponding preset positions while the mask assembly is being fabricated, optionally the mask assembly further includes an assistant member 40, including alignment patterns 401, fixed on the frame 10 as illustrated in FIG. 3A to FIG. 6 in embodiments of the disclosure.

Here the shapes of the assistant member 40 and the alignment patterns 401 on the assistant member 40, the positions at which they are arranged, and the number of alignment patterns 401 will not be limited to any particular shapes, positions, and number as long as the first support sheets 30 and the mask 20 can be fixed accurately to their corresponding preset positions.

In embodiments of the disclosure, since the mask assembly further includes the assistant member 40 on which the alignment patterns 401 are arranged, both the mask 20 and the second sub-support sheets 302 can stand net in a coordinate system created using the alignment patterns 401, the positions at which the mask 20 and the second sub-support sheets 302 are fixed on the frame 10 can be determined, and the mask 20 and the second sub-support sheets 302 can be fixed on the frame 10. Further to this, since the positions at which the mask 20 and the second sub-support sheets 302 are fixed on the frame 10 are determined according to the same alignment patterns, the precision at which the second sub-support sheets 302 and the mask 20 are matched with each other can be improved to thereby guarantee as high as precision of shielding by the second sub-support sheets 302.

Further optionally as illustrated in FIG. 3A to FIG. 6, the assistant member 40 includes two assistant sheets 402 arranged respectively on two opposite sides of the frame 10, and there are alignment holes 401 arranged on two ends of the side of each assistant sheet 402 away from the frame 10.

Here the alignment holes 401 are arranged as the alignment patterns on the two ends of the side of the assistant sheet away from the frame 10.

Here the positional relationship between the first support sheets 30 and the assistant sheets 402 will not be limited to any particular positional relationship, but the assistant sheets 402 may be perpendicular to the first support sheets 30, or the assistant sheets 402 may be parallel to the first support sheets 30. Optionally the first support sheets 30 are perpendicular to the assistant sheets 402 in embodiments of the disclosure.

In embodiments of the disclosure, the assistant member 40 includes the two assistant sheets 402, and there are the alignment holes 401 arranged on the two sides of the side of each assistant sheet 402 away from the frame 10 so that there are four mark patterns arranged on the assistant members 40, so the mask 20 and the second sub-support sheets 302 can be fixed on the frame 10 by creating the coordinate system using these four alignment patterns to thereby determine the position at which the mask 20 is fixed on the frame 10, and the positions at which the second sub-support sheets 302 are fixed on the frame 10 more precisely.

When there is a too small difference between the width of the first sub-support sheets 301 and the width of the second sub-support sheets 302, if the first sub-support sheets 301 are significantly deformed during standing net, then the orthographic projections of the first sub-support sheets 301 onto the second sub-support sheets 302 may lie beyond the boundary of the second sub-support sheets 302, thus degrading the precision of shielding by the first support sheets 30; and if when there is a too large difference between the width of the first sub-support sheets 301 and the width of the second sub-support sheets 302, or there is a very small width of the first sub-support sheets 301, an effect of supporting the mask 20 by the first sub-support sheets 301 may be degraded, or when there is a very large width of the second sub-support sheets 302, the dummy area of the mask 20 may be shielded, and thus narrowing the dummy area.

Further to this, optionally the width of the first sub-support sheets 301 is smaller than the width of the second sub-support sheets 302 by 300 μm to 500 μm in embodiments of the disclosure.

Optionally as illustrated in FIG. 3B, the mask 20 is a fine metal mask including a plurality of mask sheets (FMM sheets) 201 parallel to each other.

Here the number of mask sheets 201 in the mask 20 will not be limited to any particular number, but can be preset accordingly as needed. Four mask sheets are arranged as illustrated in FIG. 3b by way of an example.

Furthermore the positional relationship between the mask sheets 201 and the first support sheets 30 will not be limited to any positional relationship, but the mask sheets 201 may be arranged parallel to the first support sheets 30, or may be arranged intersecting with the first support sheets 30. Since the length of the mask sheets 201 (i.e. length of long side of the mask sheet) is much larger than the width thereof (i.e. length of short side of the mask sheet), when the first support sheets 30 are arranged intersecting with the mask sheets 201, the first support sheets 30 can better support the mask sheets 201, so optionally the first support sheets 30 are arranged intersecting with the mask sheets 201 in embodiments of the disclosure. Further optionally the first support sheets 30 extend in a direction across the hollow area of the frame which are perpendicular to a direction in which the mask sheets 201 extend across the hollow area of the frame as illustrated in FIG. 3B.

Figure 4:
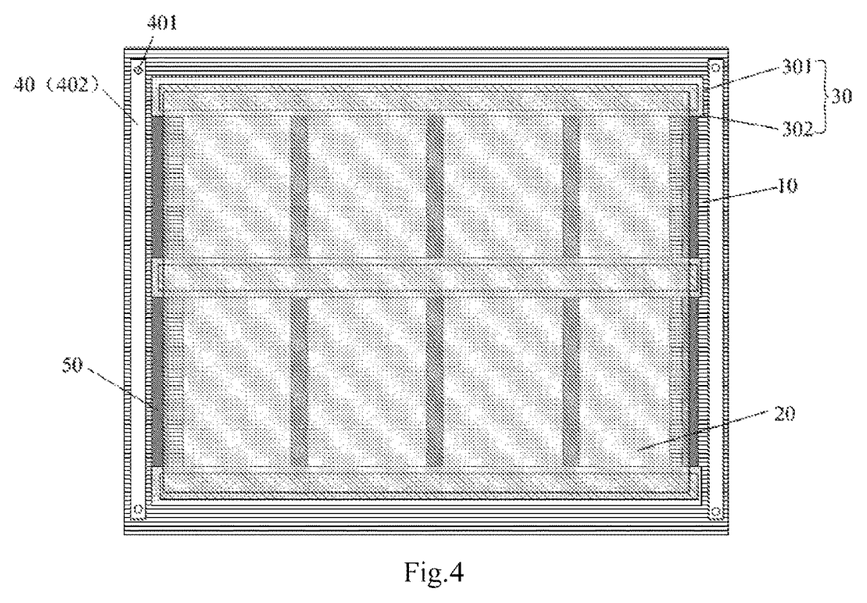
FIG. 4 is a fourth schematic structural diagram of the mask assembly according to an embodiment of the disclosure.
Figure 5:
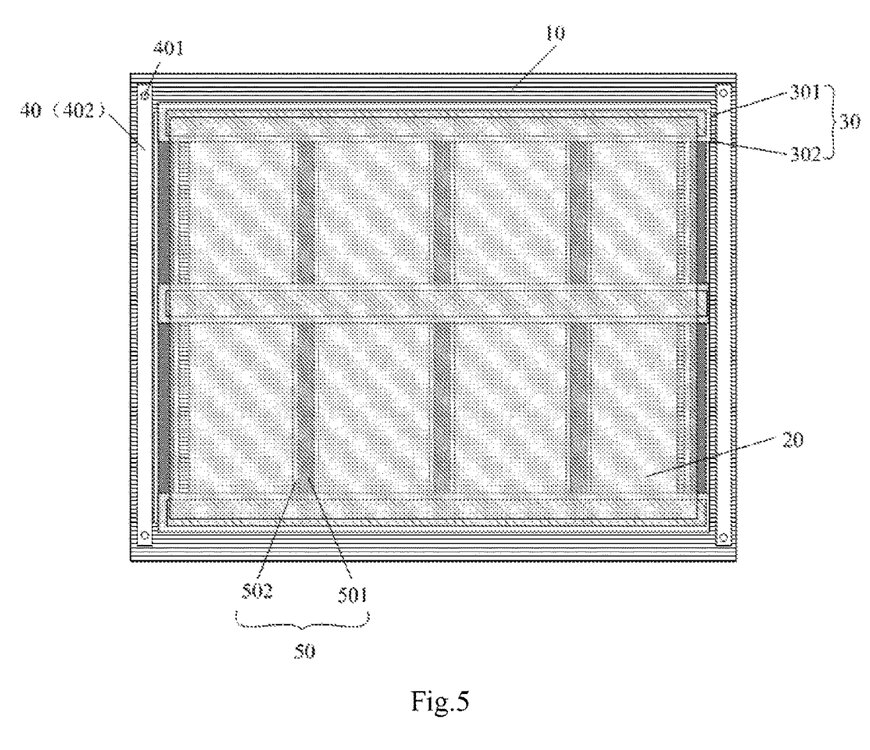
FIG. 5 is a fifth schematic structural diagram of the mask assembly according to an embodiment of the disclosure.
Figure 6:
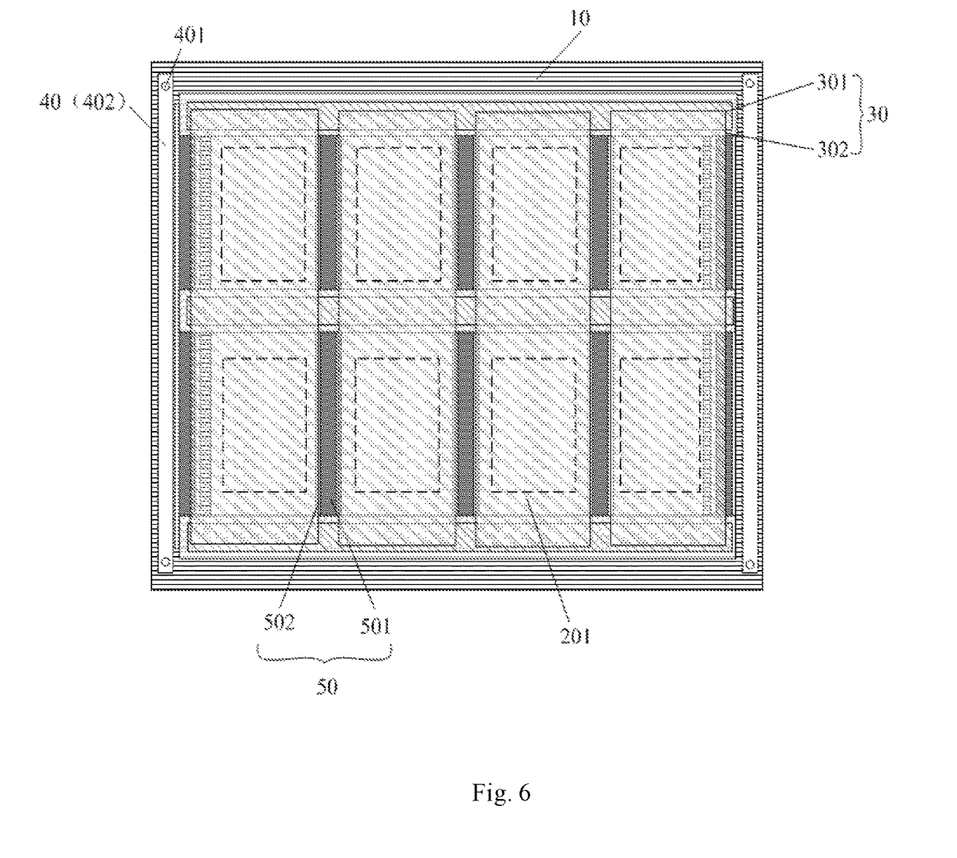
FIG. 6 is a sixth schematic structural diagram of the mask assembly according to an embodiment of the disclosure.

Optionally as illustrated in FIG. 4 to FIG. 6, the mask assembly further includes a second support sheet 50 (cover) arranged across the hollow area of the frame 10, where two opposite ends of the second support sheet 50 are fixed on the frame 10; and the second support sheet 50 is arranged intersecting with the first support sheets 30.

Here the number of second support sheets 50 arranged in the mask assembly will not be limited to any particular number, but may be preset as needed, and one second support sheet 50 may be arranged, or two or more second support sheets 50 may be arranged. When the mask assembly includes two or more second support sheets 50, optionally the second support sheets 50 are parallel to each other.

Here both the first support sheets 30 and the second support sheet 50 support the mask 20 to thereby prevent the mask 20 from drooping. The first support sheets 30 and the second support sheet 50 shall at least ensure the mask 20 to droop by no more than 200 μm. Further to this, optionally the second support sheet 50 extend in a direction across the hollow area of the frame which are perpendicular to a direction in which the first support sheets 30 extend across the hollow area of the frame in embodiments of the disclosure.

In embodiments of the disclosure, since the first support sheets 30 and the second support sheet 50 are arranged intersecting with each other, both of them support the mask 20 so that the mask 20 can be supported more effectively to thereby be prevented from drooping.

Optionally as illustrated in FIG. 5 and FIG. 6, the second support sheet 50 includes a third sub-support sheet 501 and a fourth sub-support sheet 502, where a orthographic projection of the third sub-support sheet 501 onto the fourth sub-support sheet 502 lies into the fourth sub-support sheet 502; and the thickness of the fourth sub-support sheet 502 is smaller than the thickness of the third sub-support sheet 501.

Here the orthographic projection of the third sub-support sheet 501 onto the fourth sub-support sheet 502 lies into the fourth sub-support sheet 502, but the difference between the width of the third sub-support sheet 501 and the width of the fourth sub-support sheet 502 will not be limited to any particular difference as long as the third sub-support sheet 501 can support the mask 20, and while the third sub-support sheet 501 is standing net and fixed onto the frame 10, even if the third sub-support sheet 501 is deformed, then the orthographic projection of the deformed third sub-support sheet 501 will extend into the fourth sub-support sheet 502.

Further to this, since the thickness of the fourth sub-support sheet 502 is smaller than the thickness of the third sub-support sheet 501, the fourth sub-support sheet 502 will not be easily deformed relative to the third sub-support sheet 501. In order to prevent the fourth sub-support sheet 502 from being deformed, optionally the thickness of the fourth sub-support sheet 502 shall be as small as possible while the fourth sub-support sheet 502 can be shielding in embodiments of the disclosure.

In embodiment of the disclosure, the second support sheet 50 includes the third sub-support sheet 501 and the fourth sub-support sheet 502, the fourth sub-support sheet 502 are stacked over third sub-support sheets 501; and since the thickness of the third sub-support sheet 501 is larger than the thickness of the fourth sub-support sheet 502, the third sub-support sheet 501 can function in the same way as the support sheets in the related art to support the mask 20. Further to this, since the thickness of the fourth sub-support sheet 502 is smaller than the thickness of the third sub-support sheet 501, the net-standing strain required for the fourth sub-support sheet 502 during standing net is smaller, so that the fourth sub-support sheet 502 can be avoided from being deformed, thus resulting in higher precision of net-standing by the fourth sub-support sheet 502, and higher precision of shielding by the fourth sub-support sheet 502. Furthermore the orthographic projection of the third sub-support sheet 501 extend into the fourth sub-support sheet 502, and since there is higher precision of net-standing by the fourth sub-support sheet 502, and higher precision of shielding by the fourth sub-support sheet 502, there is higher precision of net-standing by the second support sheet 50, and higher precision of shielding by the second support sheet 50, thus improving the precision of net-standing by the second support sheet 50, and the precision of shielding by the second support sheet 50, as compared with the related art.

Further optionally, as illustrated in FIG. 6, the mask 20 is a fine metal mask including a plurality of mask sheets 201 parallel to each other, where the mask sheets 201 are parallel to the second support sheets 50 arranged at the positions of gaps between the adjacent mask sheets 201.

Here the number of mask sheets 201 in the mask 20 will not be limited to any particular number, but can be preset accordingly as needed. There are four mask sheets 201 in the mask 20 as illustrated in FIG. 6 by way of an example. Furthermore an area surrounded by a dotted line of each mask sheet 201 is a working area in FIG. 6.

In embodiments of the disclosure, the second support sheets 50 are arranged at the positions of the gaps between the adjacent mask sheets 201, so that the second support sheets 50 can shield the gaps between the adjacent mask sheets 201.

Figure 7:
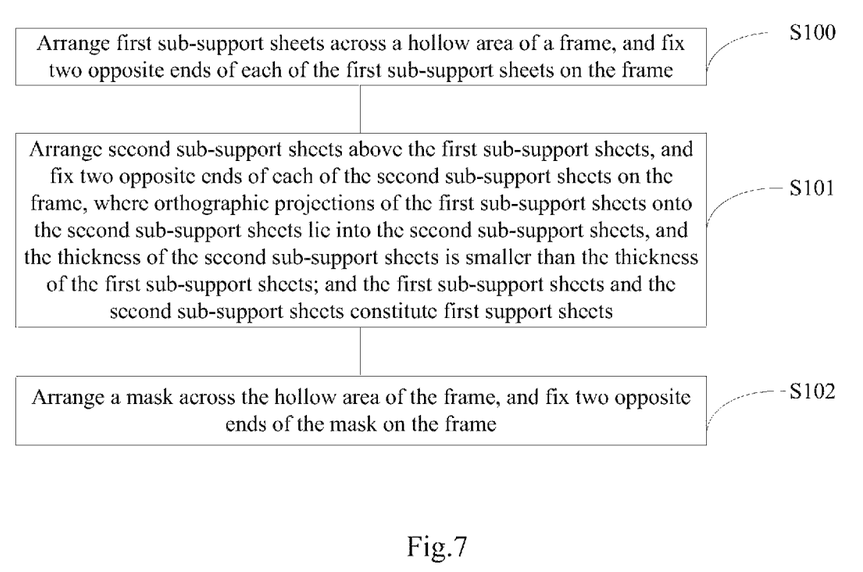
FIG. 7 is a schematic structural diagram of a method for assembling a mask assembly according to an embodiment of the disclosure.

An embodiment of the disclosure further provides a method for assembling a mask assembly as illustrated in FIG. 7, where the method includes the following steps.

Figure 8:
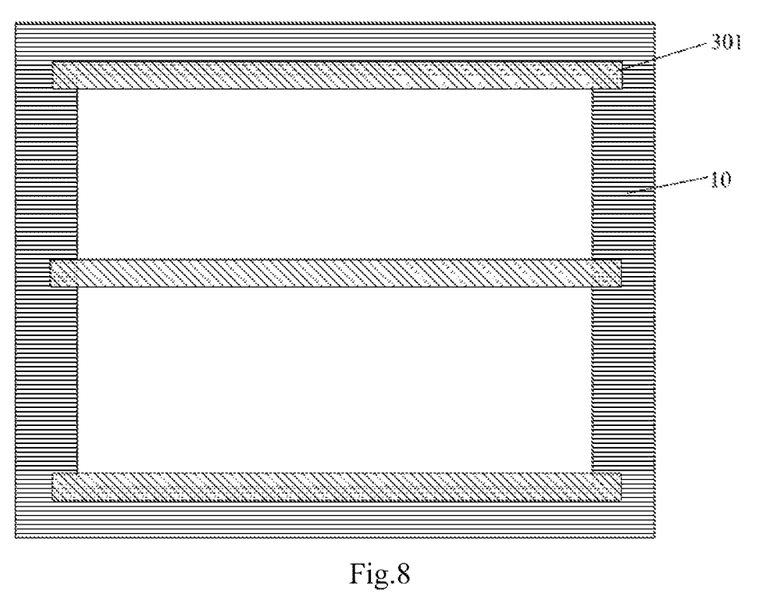
FIG. 8 is a schematic structural diagram of a frame on which a first sub-support sheet is fixed according to an embodiment of the disclosure.

The step S100 is to arrange first sub-support sheets 301 across a hollow area of a frame 10, and to fix two opposite ends of the first sub-support sheets 301 on the frame 10 as illustrated in FIG. 8.

Here the number of first sub-support sheets 301 will not be limited to any particular number, but can be preset accordingly as needed.

Further to this, the first sub-support sheets 301 can be fixed on the frame 10 by being soldered thereon.

Figure 9:
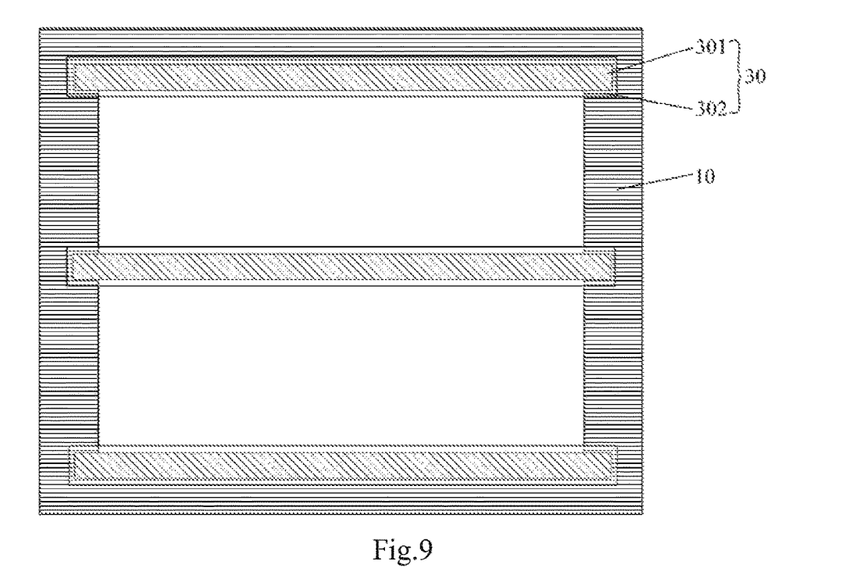
FIG. 9 is a schematic structural diagram of a frame on which a first sub-support sheet and a second sub-support sheet are fixed according to an embodiment of the disclosure.

The step S101 is to arrange second sub-support sheets 302 above the first sub-support sheets 301, and to fix two opposite ends of the second sub-support sheets 302 on the frame 10, as illustrated in FIG. 9, where orthographic projections of the first sub-support sheets 301 extend into the second sub-support sheets 302, and the thickness of the second sub-support sheets 302 is smaller than the thickness of the first sub-support sheets 301; and the first sub-support sheets 301 and the second sub-support sheets 302 constitute first support sheets 30.

It shall be noted that the number of second sub-support strips 302 is the same as the number of first sub-support strips 301, and each of the first sub-support strips 301 is provided with a second sub-support strips 302.

Here the thickness of the second sub-support strips 302 is smaller than the thickness of the first sub-support strips 301, so the second sub-support strips 302 are subjected to a smaller net-standing strain during standing net than a net-standing strain to which the first sub-support strips 301 are subjected, and consequently the second sub-support strips 302 will not be easily deformed relative to the first sub-support strips 301.

Figure 10:
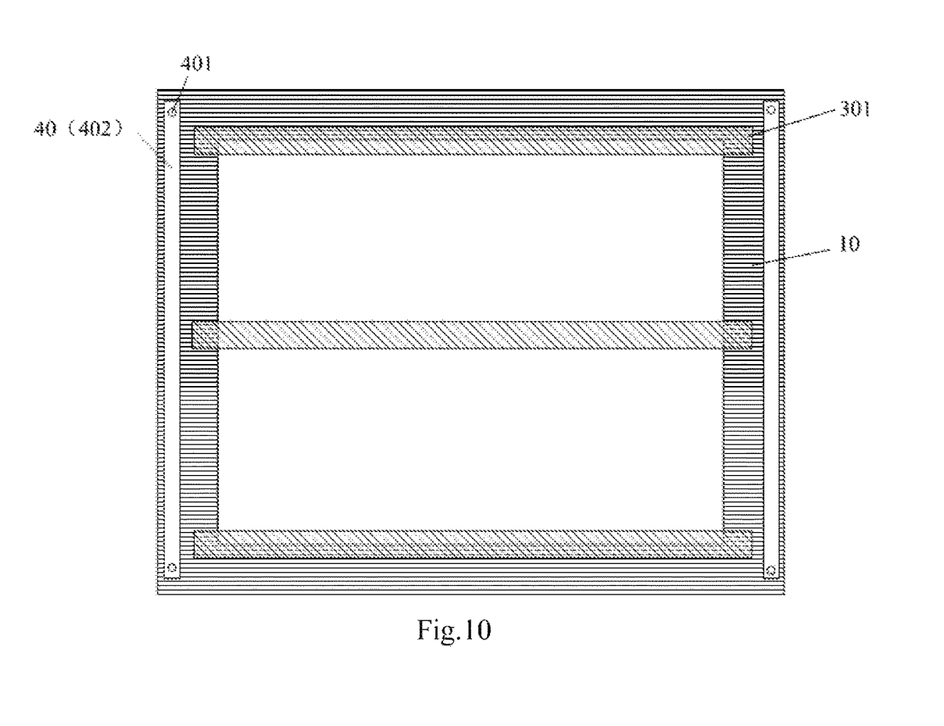
FIG. 10 is a schematic structural diagram of a frame on which an assistant sheet is fixed according to an embodiment of the disclosure.

The step S102 is to arrange a mask 20 across the hollow area of the frame 10, and to fix two opposite ends of the mask 20 on the frame 10, as illustrated in FIG. 10.

Here the mask 20 will not be limited to any particular type, but the mask 20 may be a fine metal mask or an open mask. When the mask 20 is a fine metal mask, the fine metal mask may include a plurality of mask sheets. The mask sheets may intersect with the first support sheets 30, or may be parallel to the first support sheets 30; and in embodiments of the disclosure, optionally the first support sheets 30 intersect with the mask sheets, and further optionally the first support sheets 30 extend in a direction across the hollow area of the frame which are perpendicular to a direction in which the mask sheets extend across the hollow area of the frame.

In the method for assembling a mask assembly according to embodiments of the disclosure, the first support sheets 30 in the mask assembly are structured in two layers in that the first support sheets 30 include the first sub-support sheets 301 and the second sub-support sheets 302, the second sub-support sheets are 302 are stacked over the first sub-support sheets 301; and since the thickness of the first sub-support sheets 301 is larger than the thickness of the second sub-support sheets 302, the first sub-support sheets 301 can function in the same way as the support sheets in the related art to support the mask 20. Further to this, the first support sheets 30 further include the second sub-support sheets 302, and since the thickness of the second sub-support sheets 302 is smaller than the thickness of the first sub-support sheets 301, the net-standing strain required for the second sub-support sheets 302 is smaller during standing net, so that the second sub-support sheets 302 can be avoided from being deformed, thus resulting in higher precision of net-standing by the second sub-support sheets 302, and higher precision of shielding by the second sub-support sheets 302. Furthermore the orthographic projections of the first sub-support sheets 301 extend into the second sub-support sheets 302, and since there is higher precision of net-standing by the second sub-support sheets 302, and higher precision of shielding by the second sub-support sheets 302, there is higher precision of net-standing by the first support sheets 30, and higher precision of shielding by the first support sheets 30, thus improving the precision of net-standing by the first support sheets 30, and the precision of shielding by the first support sheets 30, as compared with the related art.

Optionally the assembling method above further includes the following operations after the step S100 and before the step S101.

As illustrated in FIG. 10, two assistant sheets 402 are arranged respectively on two opposite sides of the frame 10, and there are alignment holes 401 arranged on two ends of the side of each assistant sheet 402 away from the frame 10; the two opposite ends of the second sub-support sheets 302 are fixed on the frame 10 optionally by determining the positions at which the second sub-support sheets 302 are fixed on the frame 10, according to the alignment holes 401, and fixing the two opposite ends of the second sub-support sheets 302; and the two opposite ends of the mask 20 are fixed on the frame 10 optionally by determining the position at which the mask 20 is fixed on the frame 10, according to the alignment holes 401, and fixing the two opposite ends of the mask 20.

Here the alignment holes 401 on the assistant sheets 402 can act as alignment patterns. Further to this, the positions at which the second sub-support sheets 302 are fixed on the frame 10 are determined according to the alignment holes 401, and optionally, first a coordinate system can be created according to the alignment holes 401, and then the positions at which the second sub-support sheets 302 are fixed on the frame 10 can be determined according to the created coordinate system. Alike for the mask 20, first a coordinate system can be created according to the alignment holes 401, and then thee position where the mask 20 is fixed on the frame 10 can be determined according to the created coordinate system. Since the coordinate systems are created for both the second sub-support sheets 302 and the mask 20 according to the alignment holes 401, the positions at which both the second sub-support sheets 302 and the mask 20 are fixed on the frame 10 are determined in the same coordinate system.

Here the positional relationship between the first support sheets 30 and the assistant sheets 402 will not be limited to any particular positional relationship, but the assistant sheets 402 may be perpendicular to the first support sheets 30, or the assistant sheets 402 may be parallel to the first support sheets 30. Optionally the first support sheets 30 are perpendicular to the assistant sheets 402 in the embodiment of the disclosure.

It shall be noted that how to fix the first sub-support sheets 301 on the frame 10 will not be limited to any particular means, but for example, alignment holes can be formed on the frame 10 as the alignment holes for fixing the first sub-support sheets 301 on the frame 10.

In embodiments of the disclosure, since the assistant sheets 402 are arranged on both ends of the frame 10, and the alignment holes 401 are arranged on the assistant sheets 402 as the mark patterns, the positions at which both the mask 20 and the second sub-support sheets 302 are fixed on the frame 10 can be determined according to the coordinate system created according to the alignment holes 401, and the mask 20 and the second sub-support sheets 302 can be fixed on the frame 10. Further to this, the positions at which the mask 20 and the second sub-support sheets 302 are fixed on the frame 10 can be determined according to the same mark patterns, and the precision at which the second sub-support sheets 302 and the mask 20 are matched with each other can be improved to thereby guarantee as high as precision of shielding by the second sub-support sheets 302.

Figure 11:
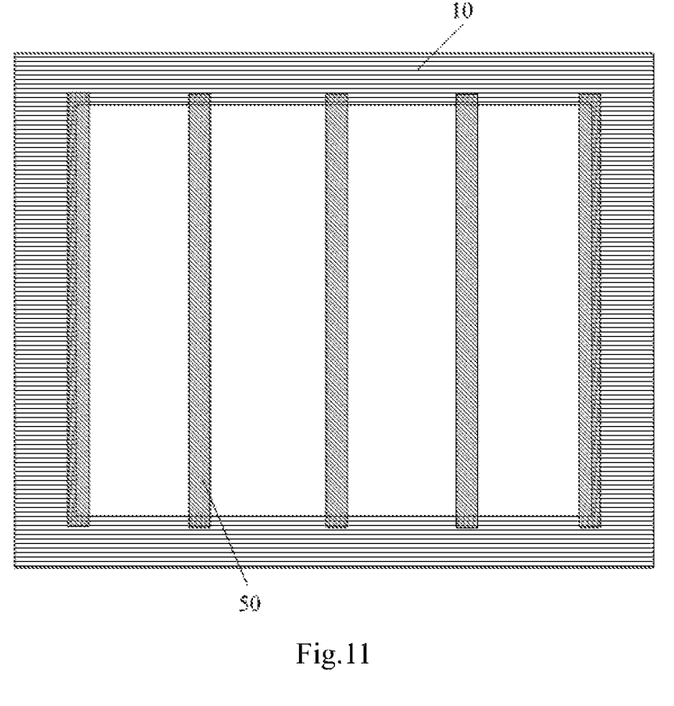
FIG. 11 is a schematic structural diagram of a frame on which a second support sheet is fixed according to an embodiment of the disclosure.

Optionally before the step S100, the assembling method above further includes: arranging a second support sheet 50 across the hollow area of the frame 10, and fixing two opposite ends of the second support sheet 50 on the frame 10, as illustrated in FIG. 11.

Here the number of second support sheets 50 arranged in the mask assembly will not be limited to any particular number, but may be preset as needed, and one second support sheet 50 may be arranged, or two or more second support sheets 50 may be arranged. When the mask assembly includes two or more second support sheets 50, optionally the second support sheets 50 are parallel to each other.

Further to this, when the mask 20 is a fine metal mask including a plurality of mask sheets, optionally the mask assembly includes a plurality of second support sheets 50, parallel to the mask sheets, each of which is arranged at the positions of gaps between the adjacent mask sheets in the embodiment of the disclosure.

Here the second support sheet 50 can be parallel to or intersect with the first sub-support sheets 301 arranged in the subsequent step S100. Since the second support sheet 50 intersecting with the first sub-support sheets 301 has a better effect of supporting the mask 20, optionally the second support sheet 50 intersects with the first sub-support sheets 301 to be formed in the embodiment of the disclosure. Further optionally the second support sheet 50 extends in a direction across the hollow area of the frame which is perpendicular to a direction in which the first sub-support sheets 301 extend across the hollow area of the frame.

Furthermore a coordinate system can be created for the second support sheet 50 according to the alignment holes arranged on the frame 10, and the second support sheet 50 can be fixed on the frame 10.

In embodiments of the disclosure, the second support 50 can be arranged to support the mask 20.

Figure 12:
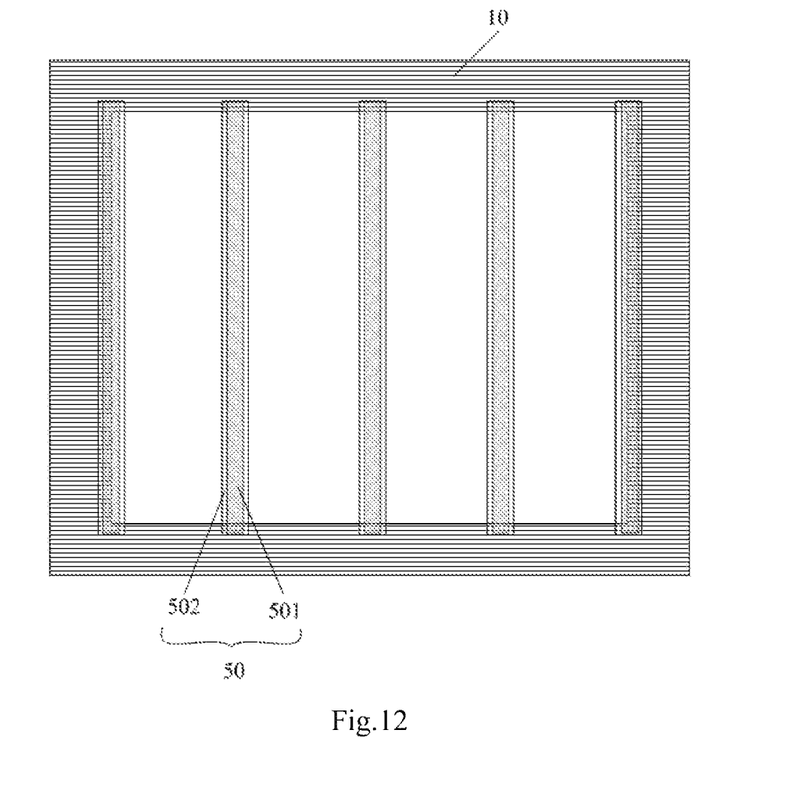
FIG. 12 is a schematic structural diagram of a frame on which a third sub-support sheet and a fourth sub-support sheet are fixed according to an embodiment of the disclosure.

Further optionally before the step S100, the assembling method above particularly further includes: arranging a third sub-support sheet 501 across the hollow area of the frame 10, and fixing two opposite ends of the third sub-support sheet 501 on the frame 10; and arranging a fourth sub-support sheet 502 above the third sub-support sheet 501, and fixing two opposite ends of the fourth sub-support sheet 502 on the frame 10, as illustrated in FIG. 12, where a orthographic projection of the third sub-support sheet 501 onto the fourth sub-support sheet 502 lies into the fourth sub-support sheet 502, and the thickness of the fourth sub-support sheet 502 is smaller than the thickness of the third sub-support sheet 501; and the third sub-support sheet 501 and the fourth sub-support sheet 502 constitute the second support sheet 50.

Here the number of third sub-support sheets 501 is the same as the number of fourth sub-support sheets 502, and each of the third sub-support sheets 501 is provided with a fourth sub-support sheets 502.

Here the thickness of the fourth sub-support sheet 502 is smaller than the thickness of the third sub-support sheet 501, so the fourth sub-support sheet 502 is subjected to a smaller net-standing strain during standing net than a net-standing strain to which the third sub-support sheet 501 is subjected, and consequently the fourth sub-support sheet 502 will not be easily deformed relative to the third sub-support sheet 501.

In embodiments of the disclosure, since the thickness of the third sub-support sheet 501 is larger than the thickness of the fourth sub-support sheet 502, the third sub-support sheet 501 can function in the same way as the support sheets in the related art to support the mask 20. Further to this, since the thickness of the fourth sub-support sheet 502 is smaller than the thickness of the third sub-support sheet 501, the net-standing strain required for the fourth sub-support sheet 502 during standing net is smaller, so that the fourth sub-support sheet 502 can be avoided from being deformed, thus resulting in higher precision of net-standing by the fourth sub-support sheet 502, and higher precision of shielding by the fourth sub-support sheet 502. Furthermore the orthographic projection of the third sub-support sheet 501 onto the fourth sub-support sheet 502 lies into the fourth sub-support sheet 502, and since there is higher precision of net-standing by the fourth sub-support sheet 502, and higher precision of shielding by the fourth sub-support sheet 502, there is higher precision of net-standing by the second support sheet 50, and higher precision of shielding by the second support sheet 50, thus improving the precision of net-standing by the second support sheet 50, and the precision of shielding by the second support sheet 50, as compared with the related art.

The foregoing disclosure is merely illustrative of the particular embodiments of the disclosure, but the scope of the disclosure as claimed will not be limited thereto, and any variations or alternatives that can readily occur to those skilled in the art without departing from the technical disclosure of the disclosure shall fall into the scope of the disclosure as claimed. Accordingly the scope of the disclosure as claimed shall be as defined in the appended claims.

The invention claimed is:

1. A mask assembly, comprising:
a frame comprising a hollow area;
a mask arranged across the hollow area of the frame, wherein two opposite ends of the mask are fixed on the frame; and
first support sheets configured to support the mask, wherein the first support sheets comprise first sub-support sheets and second sub-support sheets, wherein the second sub-support sheets are stacked over the first sub-support sheets, the first sub-support sheets and the second sub-support sheets are arranged across the hollow area of the frame, and two opposite ends of each of the first sub-support sheets, and two opposite ends of each of the second sub-support sheets are fixed on the frame;
wherein orthographic projections of the first sub-support sheets extend into the second sub-support sheets, the first sub-support sheets and the second sub-support sheets extend in a same direction across the hollow area of the frame; and a thickness of the second sub-support sheets is smaller than a thickness of the first sub-support sheets.

2. The mask assembly according to claim 1, comprises at least two first support sheets parallel to each other.

3. The mask assembly according to claim 1, further comprises an assistant member comprising alignment patterns which are fixed on the frame.

4. The mask assembly according to claim 3, wherein the assistant member comprises two assistant sheets arranged respectively on two opposite sides of the frame, and there are alignment holes arranged on two ends of a side of each assistant sheet, wherein the side is away from the frame.

5. The mask assembly according to claim 1, wherein a width of the first sub-support sheets is smaller than a width of the second sub-support sheets by 300 μm to 500 μm.

6. The mask assembly according to claim 1, wherein the mask is a fine metal mask comprising a plurality of mask sheets parallel to each other.

7. The mask assembly according to claim 6, wherein the first support sheets extend in a direction across the hollow area of the frame which are perpendicular to a direction the mask sheets extend across the hollow area of the frame.

8. The mask assembly according to claim 1, further comprises second support sheets arranged across the hollow area of the frame, and two opposite ends of each of the second support sheets are fixed on the frame; and the second support sheets are arranged intersecting with the first support sheets.

9. The mask assembly according to claim 8, wherein the second support sheets comprise third sub-support sheets and fourth sub-support sheets, wherein the fourth sub-support sheets are stacked over the third sub-support sheets;
wherein orthographic projections of the third sub-support sheets extend into the fourth sub-support sheets; and a thickness of the fourth sub-support sheets is smaller than a thickness of the third sub-support sheets.

10. The mask assembly according to claim 8, wherein the mask is a fine metal mask comprising a plurality of mask sheets parallel to each other, and the mask sheets are parallel to the second support sheets arranged at positions of gaps between adjacent mask sheets.

* * * * *